US011733893B2

(12) United States Patent
Galbraith

(10) Patent No.: US 11,733,893 B2
(45) Date of Patent: Aug. 22, 2023

(54) MANAGEMENT OF FLASH STORAGE MEDIA

(71) Applicant: International Business Machines Corporation, Armonk, NY (US)

(72) Inventor: Robert Edward Galbraith, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 154 days.

(21) Appl. No.: 17/387,472

(22) Filed: Jul. 28, 2021

(65) Prior Publication Data

US 2023/0032400 A1 Feb. 2, 2023

(51) Int. Cl.
*G06F 3/06* (2006.01)
(52) U.S. Cl.
CPC ............ *G06F 3/064* (2013.01); *G06F 3/0604* (2013.01); *G06F 3/0652* (2013.01); *G06F 3/0679* (2013.01)

(58) Field of Classification Search
None
See application file for complete search history.

(56) References Cited

U.S. PATENT DOCUMENTS

| | | | | |
|---|---|---|---|---|
| 7,610,437 B2 * | 10/2009 | Sinclair | ................. | G06F 3/0652 711/104 |
| 7,984,084 B2 * | 7/2011 | Sinclair | ............... | G06F 16/1847 707/818 |
| 8,285,918 B2 * | 10/2012 | Maheshwari | ........ | G11C 7/1072 711/159 |
| 8,443,263 B2 * | 5/2013 | Selinger | ............... | G06F 11/1068 714/768 |
| 8,873,284 B2 * | 10/2014 | Sinclair | ............... | G06F 12/0246 365/185.11 |
| 9,223,693 B2 * | 12/2015 | Sinclair | ............... | G06F 12/0246 |
| 9,336,133 B2 * | 5/2016 | Sinclair | ............... | G06F 12/0246 |
| 9,348,746 B2 * | 5/2016 | Sinclair | ............... | G06F 12/0246 |
| 9,417,809 B1 | 8/2016 | Camp et al. | | |

(Continued)

OTHER PUBLICATIONS

Garrett, T., "Enabling Intra-Plane Parallel Block Erase In NAND Flash To Alleviate the Impact of Garbage Collection", ISLPED'18 ACM International Symposium, Jul. 23-25, 2018, pp. 1-6.

(Continued)

*Primary Examiner* — Christopher D Birkhimer
(74) *Attorney, Agent, or Firm* — Scully, Scott, Murphy & Presser, P.C.

(57) ABSTRACT

A product, system, and/or method of managing memory media that includes: determining whether the memory system is low on one or more ready-to-use (RTU) Block Stripes needed to form a RTU Block Stripe Set, wherein the memory media has a plurality of Planes in each Die, all the memory media Blocks in each Block Stripe are from the same Die #and the same Plane #, each Block Stripe Set is formed of a plurality of Block Stripes all from the same Die #, and all the Blocks in each RTU Block Stripe Set have been subject to the removal process and the erasure process. The product, system, and/or method includes: establishing a pending request for a removal process and/or an erasure process for one or more determined Die #/Plane #combinations; and prioritizing in the one or more determined Die #/Plane #combinations one or more memory media Blocks for the removal and/or erasure process.

20 Claims, 7 Drawing Sheets

(56) References Cited

U.S. PATENT DOCUMENTS

| | | | | |
|---|---|---|---|---|
| 9,465,731 | B2* | 10/2016 | Sinclair | G06F 12/0246 |
| 9,734,050 | B2* | 8/2017 | Sinclair | G06F 12/0253 |
| 9,734,911 | B2* | 8/2017 | Sinclair | G06F 3/0658 |
| 9,778,855 | B2* | 10/2017 | Sinclair | G06F 3/064 |
| 10,108,543 | B1* | 10/2018 | Duggal | G06F 3/0619 |
| 10,108,544 | B1* | 10/2018 | Duggal | G06F 16/1748 |
| 10,120,613 | B2* | 11/2018 | Sinclair | G06F 12/02 |
| 10,133,490 | B2* | 11/2018 | Sinclair | G06F 3/0655 |
| 10,185,657 | B2 | 1/2019 | Zhang et al. | |
| 10,255,179 | B2* | 4/2019 | Ji | G06F 3/0659 |
| 10,365,983 | B1* | 7/2019 | Foley | G06F 11/2094 |
| 10,430,279 | B1* | 10/2019 | Dittia | G06F 3/0656 |
| 10,489,291 | B2 | 11/2019 | Hsu et al. | |
| 10,699,790 | B2 | 6/2020 | Parat et al. | |
| 10,754,769 | B2 | 8/2020 | Bennett | |
| 10,795,812 | B1* | 10/2020 | Duggal | G06F 3/067 |
| 10,838,859 | B2 | 11/2020 | Saxena et al. | |
| 10,983,715 | B2* | 4/2021 | Sharoni | G06Q 20/105 |
| 10,990,526 | B1* | 4/2021 | Lam | G06F 12/1009 |
| 11,086,537 | B2* | 8/2021 | Byun | G06F 3/0679 |
| 2007/0033325 | A1* | 2/2007 | Sinclair | G06F 3/0608 |
| | | | | 711/170 |
| 2008/0082596 | A1* | 4/2008 | Gorobets | G06F 12/0253 |
| 2008/0189477 | A1* | 8/2008 | Asano | G06F 12/0246 |
| | | | | 711/E12.008 |
| 2011/0145473 | A1* | 6/2011 | Maheshwari | G06F 12/12 |
| | | | | 711/E12.008 |
| 2011/0161784 | A1* | 6/2011 | Selinger | G06F 11/1016 |
| | | | | 714/E11.002 |
| 2011/0302358 | A1* | 12/2011 | Yu | G06F 11/108 |
| | | | | 711/E12.008 |
| 2014/0047159 | A1 | 2/2014 | Ahwal et al. | |
| 2014/0325148 | A1* | 10/2014 | Choi | G06F 3/0659 |
| | | | | 711/114 |
| 2014/0365719 | A1* | 12/2014 | Kuzmin | G06F 12/0246 |
| | | | | 711/103 |
| 2015/0227602 | A1* | 8/2015 | Ramu | G06F 11/1456 |
| | | | | 707/634 |
| 2016/0246713 | A1* | 8/2016 | Choi | G06F 3/0608 |
| 2017/0123655 | A1* | 5/2017 | Sinclair | G06F 3/061 |
| 2017/0160960 | A1* | 6/2017 | Camp | G06F 3/0689 |
| 2018/0165021 | A1 | 6/2018 | Tomic et al. | |
| 2018/0189175 | A1* | 7/2018 | Ji | G06F 3/0679 |
| 2020/0089420 | A1* | 3/2020 | Sharoni | G06Q 20/354 |
| 2020/0159460 | A1 | 5/2020 | Shivanna et al. | |
| 2020/0278805 | A1 | 9/2020 | Shahidi et al. | |
| 2020/0310686 | A1* | 10/2020 | Truong | G06F 3/061 |
| 2020/0379903 | A1 | 12/2020 | Perlmutter et al. | |
| 2021/0034301 | A1 | 2/2021 | Zhou et al. | |
| 2021/0181983 | A1* | 6/2021 | Ki | G06F 3/0619 |
| 2021/0200461 | A1* | 7/2021 | Muchherla | G06F 3/0655 |

OTHER PUBLICATIONS

Choi, W., et al., "Parallelizing Garbage Collection With I/O To Improve Flash Resource Utilization", HPDC'18 27th ACM International Symposium, Jun. 11-15, 2018, pp. 243-254.

Zhu, G., et al., "A Preliminary Study: Towards Parallel Garbage Collection For NAND Flash-Based SSDs", IEEE Access, Dec. 7, 2020, pp. 223574-223587, vol. 8.

Pletka, R., "NAND Flash Media Management Algorithms", IBM Research, Flash memory Summit, Aug. 5-8, 2019, pp. 1-22.

Yan, S., et al., "Tiny-Tail Flash: Near-Perfect Elimination of Garbage Collection Tail Latencies In NAND SSDs", FAST'17 USENIX Conference, Feb. 27-Mar. 2, 2017, pp. 15-28.

* cited by examiner

| Die#/Plane# | Queue Length |
|---|---|
| Die# = 0 / Plane# = 0 | Queue Length = 6 |
| Die# = 0 / Plane# = 1 | Queue Length = 7 |
| Die# = 0 / Plane# = 2 | Queue Length = 9 |
| Die# = 0 / Plane# = 3 | Queue Length = 10 |
| Die# = 0 / Plane# = 4 | Queue Length = 6 |
| Die# = 0 / Plane# = 5 | Queue Length = 7 |
| Die# = 0 / Plane# = 6 | Queue Length = 6 |
| Die# = 0 / Plane# = 7 | Queue Length = 6 |

•
•
•

| Die#/Plane# | Queue Length |
|---|---|
| Die# = 5 / Plane# = 0 | Queue Length = 6 |
| Die# = 5 / Plane# = 1 | Queue Length = 5 |
| Die# = 5 / Plane# = 2 | Queue Length = 5 |
| Die# = 5 / Plane# = 3 | Queue Length = 3 |
| Die# = 5 / Plane# = 4 | Queue Length = 4 |
| Die# = 5 / Plane# = 5 | Queue Length = 4 |
| Die# = 5 / Plane# = 6 | Queue Length = 2 |
| Die# = 5 / Plane# = 7 | Queue Length = 5 |

Fig. 6

MANAGEMENT OF FLASH STORAGE MEDIA

BACKGROUND OF INVENTION

The present invention generally relates to managing data storage media, e.g., flash memory media, to increase performance, including improving memory media preparation for programming with data.

With recent advancements in information technology and wide use of the Internet to store and process information, more and more demands are placed on the acquisition, processing, storage and dissemination of information by computing systems. Computing systems are being developed to handle increasing amounts of data, adding increasing data storage, and improved memory media. Computing systems are being developed to increase the speed and performance at which the computers are able to execute increasingly complex applications for business, personal use, and entertainment. Overall computer system performance is affected by each of the key elements of the computer structure, including the performance/structure of the processors, any memory caches, input/output (I/O) subsystems, efficiency of the memory control functions, the performance of the memory media and memory systems, any associated memory interface elements, and the type and structure of the memory interconnect interfaces.

The constantly increasing speed of processors which execute increasingly complex applications places more rigorous performance demands on all of the other subsystems in the computer, including the memory subsystem, where data is stored and accessed numerous times during the operation of a software application. The performance of memory is a major factor in the ultimate speed and efficiency of a computer system. The memory subsystem of most computers is normally operated by a memory controller. The task of memory controllers is to move data between the computer's memory subsystem and its one or more processors as quickly and efficiently as possible. A computer's memory subsystem often comprises memory media, typically in the form of memory devices, to store (write), access (read) and update data.

Extensive research and development efforts are invested by the industry to create improved and or innovative solutions to maximize overall system performance by improving the memory system/subsystem design and/or structure and the methods by which the memory system/subsystem operates. Such efforts have resulted in the development of different types of memory systems and/or memory media. One type of memory system is a Solid-State Drive (SSD) that uses integrated circuit assemblies to store data persistently, typically using Flash memory media, which are electronic non-volatile computer storage media that can be electrically erased and reprogrammed. Flash memory media can typically be rewritten and overridden numerous times, however, in instances the health of the flash memory media is affected by memory access operations, e.g., writing operations, where the health of the flash memory media decreases with increasing memory accesses. There are generally two types of Flash memory, for example NAND Flash and NOR Flash, named for the NAND and NOR logic gates used in their design. To further memory system performance, SSDs in embodiments can utilize Non-Volatile Memory Express (NVMe) communication interfaces and drivers.

In the design and management of Flash memory media, as can be used in SSDs, there are often criteria and constraints imposed on the Flash memory media, where some of the constraints are imposed to make the Flash memory media to be as high performance as possible. For example, Flash memory media typically has unhealthy, bad memory cells removed (e.g., through a garbage collection process) and typically needs to erase the memory media before it can be programed, e.g., ready-to-use (RTU). Unfortunately, the criteria and constraints on removing and erasing memory media, e.g., flash memory media, does not efficiently satisfy the criteria for programming the memory media with data, e.g., storing data. Managing and preparing the memory media for programming can suffer from inefficiencies of having memory media collected and erased before it can be programmed because the criteria for programming is not met. It would be advantageous to efficiently collect and erase the memory media to facilitate programming so such memory media can be ready-to-use (RTU).

SUMMARY

The summary of the disclosure is given to aid understanding of data storage media, including Flash memory media, used for example in solid state drives (SSDs), and not with an intent to limit the disclosure or the invention. The present disclosure is directed to a person of ordinary skill in the art. It should be understood that various aspects and features of the disclosure may advantageously be used separately in some instances, or in combination with other aspects and features of the disclosure in other instances. Accordingly, variations and modifications may be made to the data storage media, and/or the method of managing the data storage media to achieve different effects.

A data storage media product, system, and/or method of managing the memory media for storing and/or programming with data is disclosed. In an aspect, the data storage media product, system, and/or method is directed to managing the data storage media to prepare the media to receive and/or be programmed with data. A data storage media product, system, and/or method of managing memory media for storing data in a memory system is disclosed that includes, in one or more embodiments, determining whether the memory system is low on one or more ready-to-use (RTU) Block Stripes needed to form a RTU Block Stripe Set, wherein each Block Stripe is formed of a plurality of memory media Blocks configurable to store data and all the memory media Blocks in each Block Stripe are from the same Die #and the same Plane #where the memory media has a plurality of Planes in each Die, where all the memory media Blocks in each RTU Block Stripe have been subject to a removal process and an erasure process, and wherein each Block Stripe Set is formed of a plurality of Block Stripes and all Block Stripes in each Block Stripe Set are from the same Die #, where all the memory media Blocks in each RTU Block Stripe Set have been subject to the removal process and the erasure process. The data storage media product, system, and/or method of managing memory media in an embodiment includes: establishing, in response to the memory system being low on one or more RTU Block Stripes needed to form a RTU Block Stripe Set, a pending request for a removal process for one or more determined Die #/Plane #combinations to create one or more RTU Block Stripes needed to form a RTU Block Stripe Set; and prioritizing, in response to a pending request for a removal process for one or more determined Die #/Plane #combinations, in the one or more determined Die #/Plane #combinations one or more memory media Blocks for the removal process that create one or more RTU Block Stripes needed to form a RTU Block Stripe Set. In an approach, determining whether the memory system is low on one or more RTU Block Stripes needed to form a RTU Block Stripe Set comprises identifying one or more determined Die #/Plane #combinations low on one or more RTU Block Stripes needed to form a RTU Block Stripe Set.

In a further approach, determining whether the memory system is low on one or more RTU Block Stripes needed to form a RTU Block Stripe Set includes: reviewing a RTU Queue that tracks for each Die #/Plane #combination a number of RTU Block Stripes; and determining, in response to reviewing the RTU Queue, a maximum number of RTU Block Stripe Sets per Die #. In an aspect, determining whether the memory system is low on one or more RTU Block Stripes needed to form a RTU Block Stripe Set further includes: comparing the determined maximum number of RTU Block Stripe Sets per Die #to a minimum threshold of RTU Block Stripe Sets per Die #; and determining, in response to the determined maximum number of RTU Block Stripe Sets per Die #being less than the minimum threshold of RTU Block Stripe Sets per Die #, that the memory system is low on one or more RTU Block Stripes needed to form a Block Stripe Set. The minimum threshold of RTU Block Stripe Sets per Die #is at least one of a group consisting of: a settable, a fixed, a predetermined, a predefined, an adjustable, a programmable, or combinations thereof, number of RTU Block Stripe Sets per Die #. In an approach, identifying one or more determined Die #/Plane #combinations includes: reviewing a RTU Queue that tracks for each Die #/Plane #combination a number of RTU Block Stripes; and identifying, in response to reviewing the RTU Queue, the one or more determined Die #/Plane #combinations that cannot create a sufficient number of RTU Blocks Stripes needed to form a Block Stripe Set.

In one or more aspects, prioritizing in the one or more determined Die #/Plane #combinations one or more memory media Blocks for the removal process that create a RTU Block Stripe needed to form a RTU Block Stripe Set comprises prioritizing garbage collection on the identified one or more determined Die #/Plane #combinations one or more memory media Blocks that will create one or more RTU Block Stripes needed to form a RTU Block Stripe Set. In an aspect, prioritizing in the one or more determined Die #/Plane #combinations one or more memory media Blocks for the removal process that create one or more RTU Block Stripes needed to form a RTU Block Stripe Set comprises prioritizing searching RTR Queues for one or more Block Stripes for the removal process on the identified one or more determined Die #/Plane #combinations low on one or more RTU Block Stripes needed to form a RTU Block Stripe Set. In a further aspect, prioritizing in the one or more determined Die #/Plane #combinations one or more memory media Blocks for the removal process that create one or more RTU Block Stripes needed to form a RTU Block Stripe Set comprises limiting searching for one or more memory media Blocks for the removal process that create one or more RTU Block Stripes needed to form a RTU Block Stripe Set, first to the determined Die #/Plane #combinations.

Additionally, or alternatively, the data storage media product, system, and/or method for managing memory media further includes: establishing, in response to the memory system being low on one or more RTU Block Stripes needed to form a RTU Block Stripe Set, a pending request for an erasure process for one or more determined Die #/Plane #combinations to create one or more RTU Block Stripes needed to form a RTU Block Stripe Set; and prioritizing, in response to a pending request for an erasure process for one or more determined Die #/Plane #combinations, in the one or more determined Die #/Plane #combinations one or more memory media Blocks for the erasure process that create one or more RTU Block Stripes needed to form a RTU Block Stripe Set. Prioritizing in the one or more determined Die #/Plane #combinations one or more memory media Blocks for the erasure process that create one or more RTU Block Stripes needed to form a RTU Block Stripe Set in an embodiment includes prioritizing searching RTE Queues for one or more Block Stripes for the erasure process on the identified one or more determined Die #/Plane #combinations low on one or more RTU Block Stripes needed to form a RTU Block Stripe Set, wherein the RTE Queues are organized by Die #/Plane #combinations, and in a further aspect includes limiting searching for one or more memory media Blocks for the erasure process that create one or more RTU Block Stripes needed to form a RTU Block Stripe Set, first to the determined Die #/Plane #combinations.

The foregoing and other objects, features, and advantages of the invention will be apparent from the following more particular descriptions of exemplary embodiments of the invention as illustrated in the accompanying drawings.

BRIEF DESCRIPTION OF THE DRAWINGS

The various aspects, features, and embodiments of a data storage system, data storage media, and/or method of managing the data storage media, will be better understood when read in conjunction with the figures provided. Embodiments are provided in the figures for the purpose of illustrating aspects, features, and/or various embodiments of the data storage system, data storage media or memory media, and methods of managing the data storage media, including preparing electronic data storage media so that it is ready to use (RTU) (e.g., ready for programing with data), but the claims should not be limited to the precise system, embodiments, methods, processes and/or devices shown, and the features, and/or processes shown may be used singularly or in combination with other features, and/or processes. It may be noted that a numbered element is numbered according to the figure in which the element is introduced, is often, but not always, referred to by that number in succeeding figures, and like reference numbers in the figures often, but not always, represent like parts of the illustrative embodiments of the invention.

FIG. 6 illustrates a diagramatic block diagram of RTU Queues in a memory system having memory media according to an embodiment of the disclosure;

DETAILED DESCRIPTION

The following description is made for illustrating the general principles of the invention and is not meant to limit the inventive concepts claimed herein. In the following detailed description, numerous details are set forth in order to provide an understanding of data storage systems and/or electronic memory media, for example NAND Flash data storage media, for use in, for example, Solid State Drives (SSDs), and methods of managing the data storage media (e.g., preparing the memory media for programming), however, it will be understood by those skilled in the art that different and numerous embodiments of the data storage media, and methods of managing the data storage media, for example preparing the data storage media so that it is ready-to-use (RTU) (e.g., ready for programming with data), may be practiced without those specific details, and the claims and invention should not be limited to the data storage system, memory media, methods of managing the data storage media, and/or details specifically described and shown herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc. It must also be noted that, as used in the specification and the appended claims, the singular forms "a," "an" and "the" include plural referents unless otherwise specified, and that the terms "comprises" and/or "comprising" specify the presence of stated features, integers, steps, operations, elements, and/or components, but do not preclude the presence or addition of one or more features, integers, steps, operations, elements, components, and/or groups thereof.

The following discussion omits or only briefly describes conventional features of data storage media, including, for example, Solid State Drives (SSDs) and/or Flash memory media, and/or methods of managing data storage devices and memory media which are apparent to those skilled in the art. It is assumed that those skilled in the art are familiar with the general structure, architecture, operation, and management of data storage systems and memory media, and, in particular, Solid State Devices (SSDs) and Flash memory media, including NAND Flash memory media.

Figure 1:
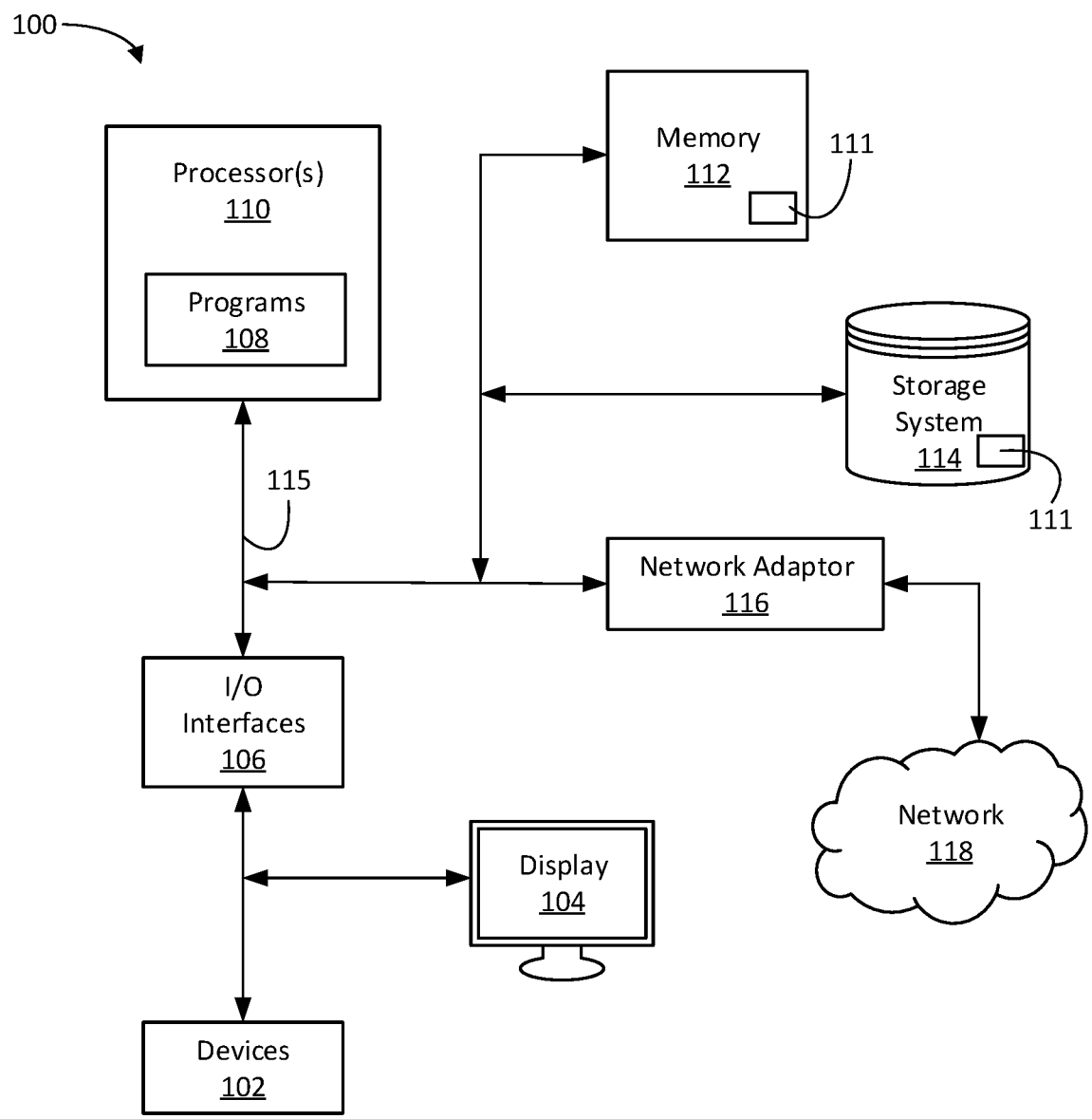
FIG. 1 illustrates an example of a computing system in which aspects of the present disclosure may be practiced.

FIG. 1 illustrates an example computing and/or data processing system 100 in which aspects of the present disclosure may be practiced. It is to be understood that the computer and/or data processing system depicted is only one example of a suitable computing system and is not intended to suggest any limitation as to the scope of use or functionality of embodiments of the present invention. For example, the system shown may be operational with numerous other special-purpose computing system environments or configurations. Examples of well-known computing systems, environments, and/or configurations that may be suitable for use with the system shown in FIG. 1 may include, but are not limited to, personal computer (PC) systems, server computer systems, mainframe computer systems, thin clients, thick clients, desktop computers, handheld or laptop devices, multi-processor systems, microprocessor-based systems, network PCs, minicomputer systems, smart phones, set top boxes, programmable consumer electronics, telephones, pagers, teleconferencing systems, appliances, automobiles, electronic devices, and distributed cloud computing environments that include any of the below systems or devices, and the like.

In some embodiments, the computer system 100 may be described in the general context of computer system executable instructions, embodied as program modules, e.g., program modules 108, stored in memory 112, being executed by the computer system. Generally, program modules may include routines, programs, objects, components, logic, data structures, and so on that perform particular tasks and/or implement particular input data and/or data types in accordance with the present invention.

The components of the computer system may include, but are not limited to, one or more processors or processing units 110, a memory 112, and a bus 115 that operably couples various system components, including memory 112 to processor 110. In some embodiments, the processor 110, which is also referred to as a central processing unit (CPU) or microprocessor, may execute one or more programs or modules 108 that are loaded from memory 112 to memory local to the processor, where the program module(s) embody software (program instructions) that cause the processor to perform one or more operations. In some embodiments, module/program 108 may be programmed into the integrated circuits of the processor 110, loaded from memory 112, loaded from data storage system 114, network 118 and/or combinations thereof.

The processor (or CPU) 110 includes various registers, buffers, execution units, cache, memories, and other units formed by integrated circuitry, and may operate according to reduced instruction set computing ("RISC") techniques. The processor 110 processes data according to processor cycles, synchronized, in some aspects, to an internal clock (not shown). Bus 115 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus. The computer system may include a variety of computer system readable media, including non-transitory readable media. Such media may be any available media that is accessible by the computer system, and it may include both volatile and non-volatile memory media, removable and non-removable memory media.

Memory 112 (sometimes referred to as system memory) can include computer readable media in the form of volatile memory, such as random-access memory (RAM), cache memory and/or other forms. Memory 112 can also include or constitute a Solid-State Drive (SSD), and can include flash memory media 111, e.g., NAND Flash Memory Media as described herein. Computer system 100 may further include other removable/non-removable, volatile/non-volatile computer system storage media. By way of example only, storage system 114 can be provided for reading from and writing to a solid-State Drive (SSD) 114 that includes Flash memory media 111. Storage system 114 in an embodiment can also include or constitute, for example, non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 115 by one or more data media interfaces.

The computer system may also communicate with one or more external devices 102 such as a keyboard, track ball, mouse, microphone, speaker, a pointing device, a display 104, etc.; one or more devices that enable a user to interact with the computer system; and/or any devices (e.g., network card, modem, etc.) that enable the computer system to communicate with one or more other computing devices. Such communication can occur via Input/Output (I/O) interfaces 106.

Still yet, the computer system can communicate with one or more networks 118 such as a local area network (LAN), a general wide area network (WAN), and/or a public network (e.g., the Internet) via network adapter 116. As depicted, network adapter 116 communicates with the other components of computer system via bus 115. Communications or network adapter 116 interconnects bus 115 with an outside network 118 enabling the data processing system 100 to communicate with other such systems. Additionally, an operating system such as, for example, AIX ("AIX" is a trademark of the IBM Corporation) is used to coordinate the functions of the various components shown in FIG. 1. It should be understood that although not shown, other hardware and/or software components could be used in conjunction with the computer system. Examples include, but are not limited to: microcode, device drivers, redundant processing units, external disk-drive arrays, RAID systems, tape drives, and data archival storage systems, etc.

Figure 2:
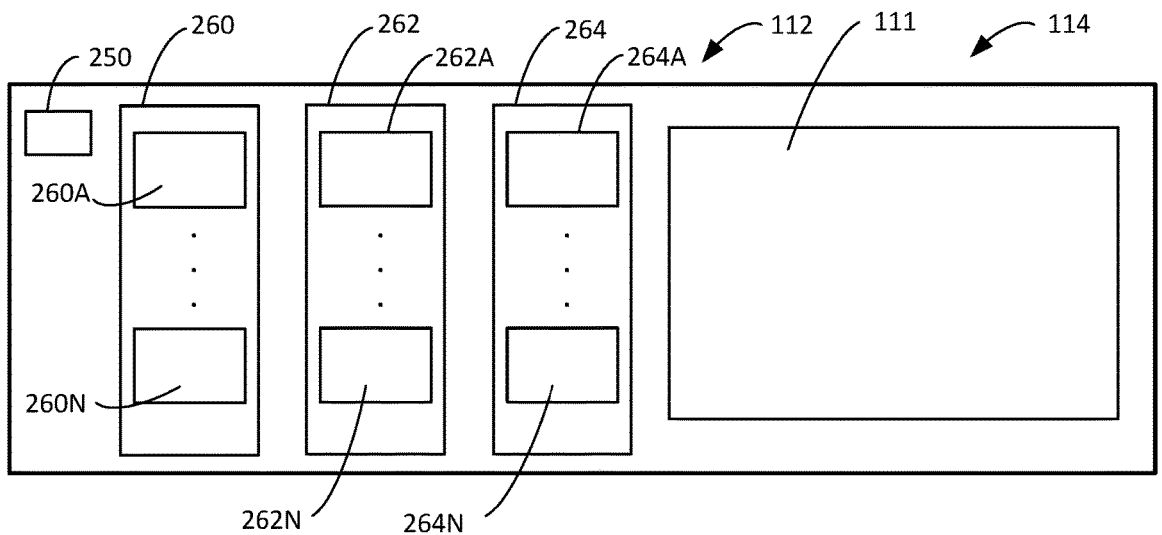
FIG. 2 is a block diagram illustrating a memory system according to an embodiment of the disclosure.

In a preferred embodiment, memory 112 can include or constitutes a Solid-State Drive (SSD) that preferably as shown in FIG. 2 includes a controller 250, one or more RTU Queues 260 (e.g., 260A . . . 260N), one or more RTR Queues 262 (e.g., 262A . . . 262N), one or more RTE Queues 264 (e.g., 264A . . . 264N), and Flash memory media 111. The controller 250 contains circuitry and logic to manage the memory media 111, including processing the memory media 111 so that it is Ready-to-Use (RTU), e.g., ready to be programmed with data. Memory 112 includes one or more RTU Queues 260A-260N which manage and track the memory media 111 that is Ready-To-Use (RTU), one or more RTR Queues 262A-262N which manage and track memory media 111 that is Ready-To-Remove, and one or more RTE Queues 264A-264N which manage and track memory media 111 that is Ready-To-Erase.

Figure 3:
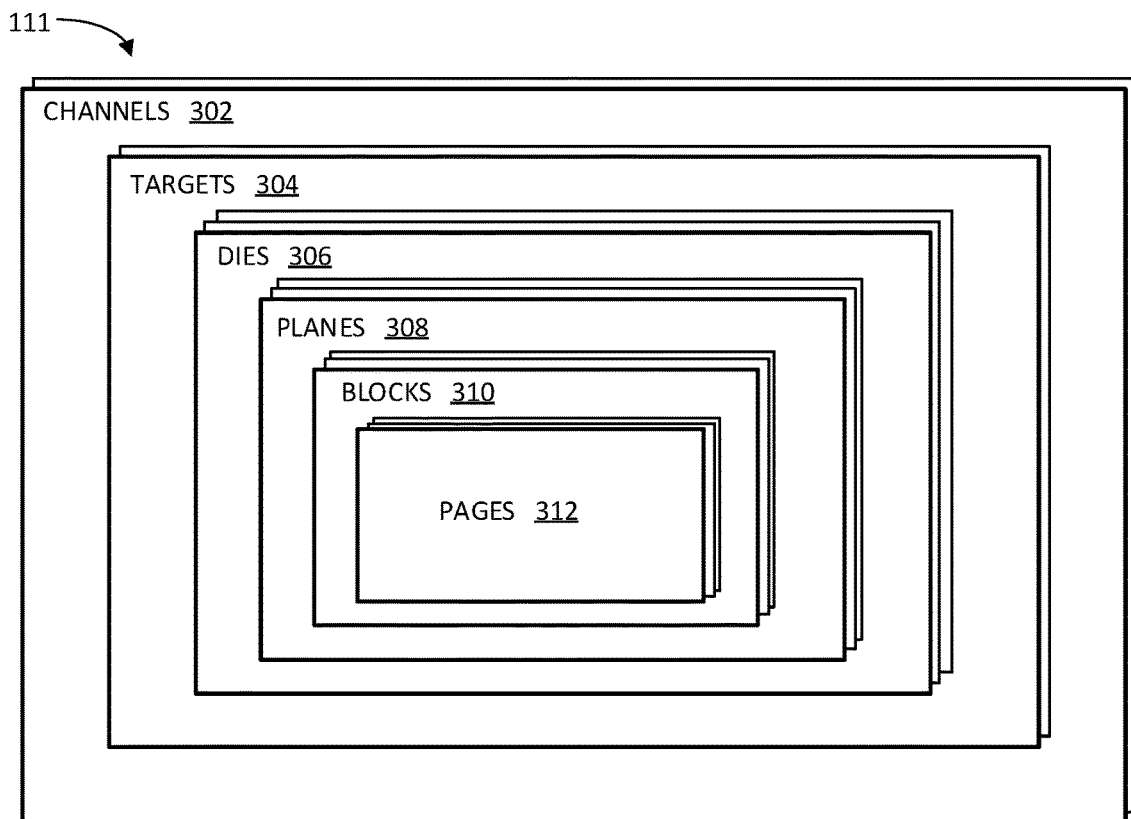
FIG. 3 is a diagram illustrating an organization of memory media, e.g., NAND Flash media, according to an embodiment of the disclosure, that can be used in a memory system.

In an aspect the memory media 111, e.g., Flash memory media 111, is organized as shown in FIG. 3, and includes one or more Channels 302, in an example embodiment thirty-two (32) channels. Each Channel 302 includes one or more targets 304 where each target 304 has a number of Dies 306, in an example embodiment sixteen (16) Dies 306. Each Die 306 includes a number of Planes 308, in an example embodiment eight (8) Planes 308, where each Plane 308 includes a number of Blocks 310, in an example embodiment, each Plane 308 has seven hundred (700) Blocks 310. Each Block 310 contains a number of Pages 312, in an example embodiment each Block 310 has 768 Pages 312. A Page 312 of memory can for example contain 2 Kilobytes (2 KB) of data. Other Page sizes are contemplated, e.g., 4 KB of data per page.

While in the example embodiment, a Page 312 holds 2 KBs of data, and there are 768 Pages 312 in each Block 310, and 700 Blocks 310 in each Plane 308, and 8 Planes 308 in each Die 306, and 32 Channels 302 in Memory 112, it can be appreciated that Pages 312 can contain more or less kilobytes of data, Blocks 310 can contain more or less Pages 312, Planes 308 can contain more or less Blocks 310, Dies 306 can contain more or less Planes 308, and there can be more or less channels 302 in other embodiments of memory 112. The Flash memory media 111 can be arranged on one or more chips, and in an embodiment each Flash chip can have two or four channels 302 per chip (device package). In an embodiment, thirty-two (32) channels 302 are achieved with sixteen (16) Flash chips (device packages), where each chip has two channels 302. It can be further appreciated that more or less Channels 302 of Flash memory media 111 can be contained on a Flash chip. Thus, while a particular arrangement and architecture for the Flash memory media 111 has been described in FIG. 3, it should be appreciated that other arrangements and architectures are contemplated for the Flash memory media 111. In addition, while memory media 111 has been described using the terms Channels, Dies, Planes, Blocks and Pages, it can be appreciated that other terminology can be used to describe the organization of memory media 111, e.g., Flash memory media, that is within the present disclosure.

In managing memory, for example memory 112 containing flash memory media 111, the goal is to produce Ready-to-Use (RTU) Block Stripe Sets, which can be used to store data. It can be appreciated that in one or more embodiments a Block 310 of memory is the smallest unit of memory, e.g., Flash memory media, that can be erased. A Block Stripe 415, also referred to as a virtual repair unit (VRU), is a set of up to thirty-two (32) Blocks 310, where all the Blocks 310 have the same Plane number (Plane #) and the same Die number (Die #), with each Block 310 being on a different Channel 302. A Block Stripe Set 420 is a group of Block Stripes 415 (each with the same Die #), where there is one Block Stripe 415 on each of the Planes 308, e.g., planes 0-7 in the example embodiment of FIG. 3.

Figure 4:
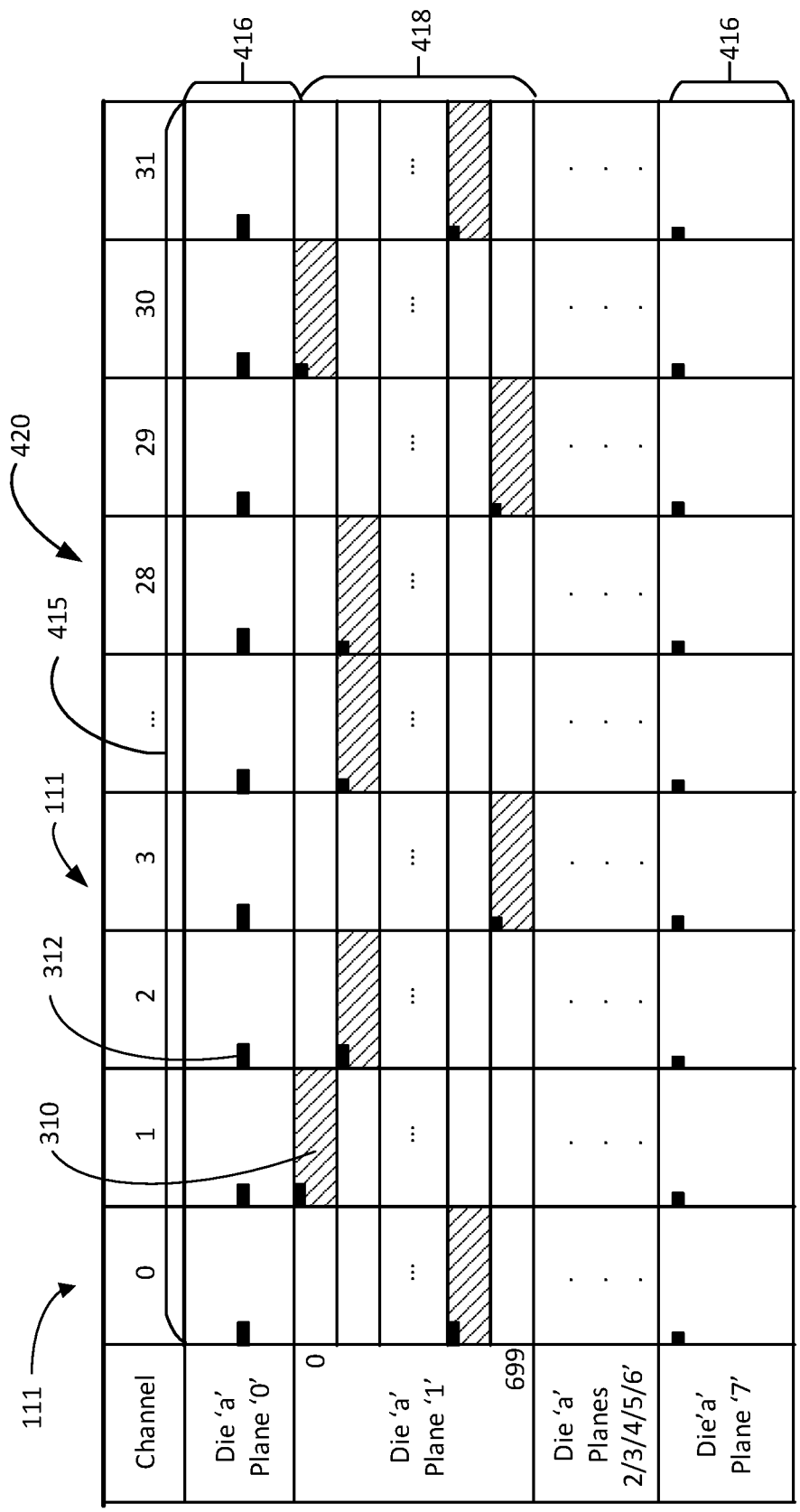
FIG. 4 is a diagram illustrating an example of a Block Stripe and a Set of Block Stripes (e.g., a Block Stripe Set) according to an embodiment of the disclosure.

FIG. 4 is a further diagram illustrating an embodiment of the organization of memory 112, more particularly Flash memory media 111 showing Pages 312, Blocks 310 and Block Stripes 415. The black solid boxes illustrate Pages 312, while the cross hatched boxes represent Blocks 310. In the example embodiment, there are 768 Pages 312 (solid boxes in FIG. 4) in each Block 310 (each cross-hatched box in FIG. 4). Each row 416 in FIG. 4 represents a Plane # in a Die #, and there are eight (8) rows 416, one row 416 for each Plane # on a Die #, (e.g., Planes 0-7). There are thirty-two (32) columns in each row, each column representing a Channel 302. FIG. 4 illustrates further in row 418 (labeled Die 'a', Plane '1') that each Plane 308 is divided into 700 Blocks 310 (e.g., 0-699), as there are 700 Blocks 310 in each Plane 308. That is, although not shown for each of the rows 416, each row 416 is sub-divided into 700 sub-rows. Block Stripe 415 in FIG. 4 is illustrated as a row of Blocks 310. Row 418 labeled Die 'a', Plane '1' shows that each Block 310, as shown by cross-hatching, that makes up the Block Stripe 415 can be a different Block number (B #). FIG. 4 represents a Set 420 of Block Stripes 415 as each row 416 from Die 'a', Plane '0' through Plane '7', contains a Block Stripe 415. That is, each of Planes 0-7 in Die 'a' (e.g., each of the rows 416 in FIG. 4) contain a Block Stripe 415 and all the Block Stripes 415 represent a Block Stripe Set 420. In FIG. 4, each row 416 represents a Block Strip 415, and all eight rows 416 represent a Block Stripe Set 420.

While the example Block Stripe 415 contains up to thirty-two (32) blocks it can be appreciated that a Block Stripe 415 can contain more or less Blocks 310. Any of Blocks 310 for example can be marked as a "bad block"

either at chip manufacturing (a factory bad block) or later during memory operation (a grown bad block). Also, there can be failures where an entire Plane 308, Die 306, or Channel 302 can be affected which makes all Blocks 310 on that Plane 308, Die 306, or Channel 302 bad. In addition, as a Block 310 is the smallest unit of memory that can be erased, if a Page 312 is bad, then the entire block 310 containing the Page 312 is marked unusable. In those situations it can be desirable to create a Block Stripe 415 with less than thirty-two (32) Blocks 310.

In terms of managing memory 112, containing for example flash memory media 111, while the goal is to produce Ready-to-Use (RTU) Block Stripe Sets 420 for programming, there are a number of competing constraints or parameters when managing and processing flash memory media. When preparing memory to produce RTU Block Stripe Sets 420, a garbage collection process must select Block Stripes that may contain valid data and move (migrate) the valid data such that the Blocks in the Block Stripe may be erased for future use in the same of different Block Stripe. Selecting a Block Stripe for garbage collection may be done based on several criteria. One criteria would be selecting a Block Stripe with degraded Blocks, that is, Blocks which risk the data not being retained by the Flash media unless the data is moved within some period of time. Block Stripes are typically created with Blocks of similar health, for example, blocks which have been programmed and erased a similar number of times which affect the period of time the blocks may retain data before the data needs to be moved (migrated). The most healthy Blocks typically have fewer program/erase cycles while less healthy blocks typically have greater program/erase cycles. However, the most common criteria used for selecting a Block Stripe for garbage collection is based upon dirtiness, that is, having the least number of valid pages which must be moved (migrated) before the Blocks in the Block Stripe can be erased. How "dirty" a Block Stripe is depends upon how many Pages in the Block Stripe have been invalidated because a newer version of the data was written to a different location (i.e. the old versions of data are no longer valid). Block Stripes with the most invalidated Pages are considered the "dirtiest" and require the least amount of data be moved (migrated) by the garbage collection process. It is very desirable, for example, for the garbage collection process to select Block Stripes which are the dirtiest.

In addition, for example, sets of Block Stripes need to be created with properly incrementing planes so that programs can be performed as multi-plane programs where multiple planes (e.g., 8 planes) can be programed simultaneously in the same amount of time as a single plane can be programmed. This programming performance enhancement, however, constrains the set of Block Stripes to be for the same Die and include a Block Stripe for each of the planes, e.g., 0-7.

Another constraint or parameter in managing memory, for example flash memory media (e.g., NAND Flash memory), and preparing the memory media to be RTU, is that memory media has to be erased in order to be programmed. An additional constraint or parameter in preparing memory for RTU is that in an embodiment, multiple Block Stripes are erased in parallel to increase memory performance. When erasing multiple Block Stipes in parallel, there is the further constraint that each Block Stripe needs to be from a different Die #, since only one command can be outstanding on a Die at any given moment in time. So, in the example embodiment of FIGS. 3 & 4, eight (8) Block Stripes 415 can be erased together, but they must be from unique Dies, e.g., cannot have the same Die #.

Another constraint or parameter in managing memory media, for example flash memory media (e.g., NAND Flash memory media), and preparing memory media to be RTU, is that Block Stripe Sets 420 with properly incrementing Planes 308 are needed. In Flash memory media, multiple Planes 308, e.g., eight (8) Planes in the example embodiment of FIGS. 2 & 3, can be programmed in the same amount of time as a single plane, often referred to a multi-plane programming capability. Frequently, Flash memory media takes advantage of the multi-plane programming capability performance enhancement, which requires enough RTU Block Stripes to be properly organized in a Block Stripe Set 420, i.e., a RTU Block Stripe 415 for each of Planes 0-7 with the same Die #.

Unfortunately, the criteria, constraints, and/or parameters for garbage collection (e.g., removing memory media) and erasing memory media does not efficiently satisfy the criteria, constraints, and/or parameters for programming the memory media. While the memory media can be processed and managed in a manner to prepare memory media to be RTU, e.g., ready to be programmed with data, the memory media typically will suffer from the inefficiency of having memory media removed that targets the dirtiest (most invalidated pages) memory media, and/or erasing memory media via the most efficient erasing methods, which do not meet the memory media programming requirements, and accordingly results in inefficient memory media management and processing to create RTU memory media. For example, while eight (8) Block Stripes can be erased together they must be from different Dies, which is at odds with creating a RTU Block Stripe which requires a RTU Block from each Channel with the same Die # and same Plane #, and in one or more optional aspects with the same health level. Some individual Block Stripes are RTU but the Block Stripe Set is lacking other Block Stripes that are RTU to form a complete Block Stripe Set (these Block Stripes are sometimes referred to as non-settable), and thus the individual (non-settable) Block Stripes are of no use until a complete Block Stripe Set can be formed. It would be advantageous to prioritize memory media management to provide a more efficient and improved process for preparing the memory media for programming, e.g., making the memory media RTU. In one or more embodiments, in order to program the memory media, e.g., the Flash memory media (for example, NAND Flash Media), eight (8) Block Stripes must be RTU and arranged/put in a Block Stripe Set, all with the same Die # and properly incrementing Planes 308 (e.g., Planes 0-7).

In one or more embodiments, a feedback mechanism is provided which provides additional input into the removal (garbage collection) process and/or the erasure process such that RTU Block Stripes are more efficiently produced which meet the criteria, constraints, and/or parameters for programming with data, e.g., for performing multi-plane programs. In a further aspect, a feedback mechanism is provided which permits a memory controller, e.g., a NAND controller, to run reliably while keeping a lower percentage of Ready-to-Use (RTU) Block Stripes, thus resulting in less over-provisioning. In an approach, a feed-back mechanism attempts to drive the non-settable Block Stripes to zero.

In one or more embodiments, a need is established (e.g., an indication/request is turned on) if memory is low on one or more RTU Block Stripes for a particular Die # and/or Plane # that can be used to facilitate creating a RTU Block Stripe Set. In one or more aspects, the need, indication, and/or request is satisfied in response to a Block Stripe for the particular Die #and/or Plane #being removed (e.g., garbage collected) and erased for the particular Die #and/or Plane #to create a RTU Block Stripe. In an aspect the need, indication, and/or request is turned off (de-established) in response to the need, indication, and/or request being acted upon or satisfied (e.g., to prevent the need, indication, and/or request from being acted upon multiple times). In one or more optional approaches, the health of the Blocks and/or Block Stripes can be taken into consideration when creating one or more Block Stripes, and/or a Block Stripe Set. For example, a single Block Stripe can be created using Blocks having the same or nearly the same health level.

In an embodiment, establishing the need (for RTU Block Stripes) permits the firmware, preferably as part of the controller, attempting to form RTU Block Stripe Sets to request the garbage collection (e.g., a Ready-To-Remove (RTR) process) and the erase process (e.g., a Ready-To-Erase (RTE) process) to prioritize selecting Blocks to create RTU Block Stripes from the needed Die #/Plane #, and optionally the desired health, so that a minimum number of RTU Block Stripes will exist that can be placed into and form a complete Block Stripe Set that is RTU. Once a Block Stripe Set is programmed, in one or more embodiments each Block Stripe is managed independently, and, in an aspect, can later be garbage collected independently of one another.

Figure 5:
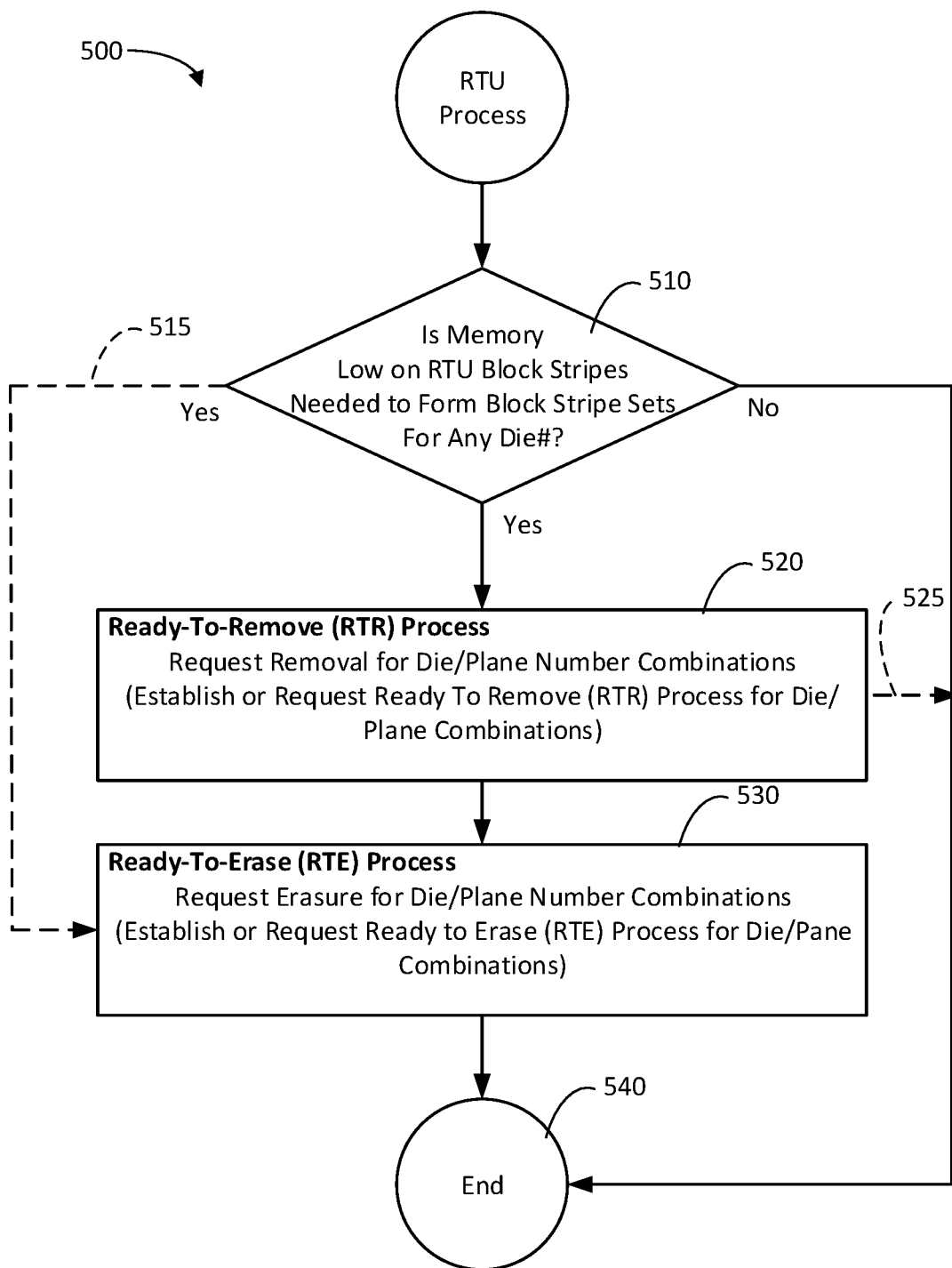
FIG. 5 illustrates a flowchart of a method of managing memory media according to an embodiment of the disclosure.

FIG. 5 is an exemplary flowchart in accordance with an embodiment illustrating and describing an overview of a method of handling and/or managing memory media, for example, flash memory media, so that the memory media is ready to be programmed with data, e.g., Ready-to-Use (RTU). While the method 500 is described for the sake of convenience and not with an intent of limiting the disclosure as comprising a series and/or a number of steps, it is to be understood that the process 500 does not need to be performed as a series of steps and/or the steps do not need to be performed in the order shown and described with respect to FIG. 5, but the process 500 may be integrated and/or one or more steps may be performed together, simultaneously, or the steps may be performed in the order disclosed or in an alternate order.

FIG. 5 is an overview of a process 500 to prepare and make Ready-To-Use (RTU) memory media, for example Flash memory media 111. In one or more aspects, making Flash memory media RTU includes processing and managing the memory media so that it is ready to be programmed with data. A RTU Block Stripe is a Block Stripe constructed out of garbage collected blocks, assigned to a Block Stripe, and erased. That is, a RTU Block Stripe are a collection of Blocks in the same Die #/Plane #combination that have been subject to a collection/removal process and an erasure process and assigned to a Block Stripe. A RTU Block Stripe Set requires eight (8) RTU Block Stripes with the same Die #and incrementing Plane #(Planes 0-7). In the process 500 of making the memory media RTU, in an embodiment at 510 it is determined whether memory media is low on one or more Ready-to-Use (RTU) Block Stripes Sets. In an aspect, at 510 it is determined whether memory media is low on one or more RTU Block Stripe Sets for any Die #/Plane #that are needed to form a Block Stripe Set. In an approach, it is determined whether memory media is low on one or more RTU Block Stripes needed to form a Block Stripe Set for any Die #. In a further approach, at 510 it is determined whether memory media is low on one or more RTU Block Stripes for any Die #/Plane #needed to form one or more Block Stripe Sets for each Die #.

In an embodiment, the controller, e.g., controller 250, attempts to keep a minimum number of Block Stripe Sets 420 for each Die 306 that are Ready-to-Use (RTU). Memory 112 contains, in an example embodiment, a RTU queue 260 for each Die #/Plane #that keeps count of the number of Block Stripes 415 that are Ready-To-Use (RTU). FIG. 6 shows an example of RTU queues 260, and more particularly RTU Queue 260A that represents Die #0, and RTU Queue 260F that represents Die #5. In the example of FIG. 6, the first column in each row represents a Die #and a Plane #, and the second column in each row is the Queue Length 265, where the Queue Length 265 represents a number of RTU Block Stripes 415 in the identified Die #and Plane #, and thus identifies how many RTU Block Stripe Sets 420 could be formed for each Die #. So, for example, the Queue Length 265 for Die 0, Plane 0 is 6, indicating that Die 0/Plane 0 has 6 Block Stripes 415 that are RTU.

In an embodiment, determining at 510 whether memory media is low on one or more RTU Block Stripes 415 needed to form one or more Block Stripe Sets 420 for each Die #is a matter of reviewing the Queue Length 265 for each Die #/Plane #in the RTU Queues 260. The controller in an aspect sets, or is set to keep, a minimum number of RTU Block Stripe Sets 420 for each Die, e.g., at least four (4) RTU Block Stripe Sets 420 per Die #. The system, preferably the controller 250, to determine whether a Die #/Plane #is low on one or more RTU Block Stripes looks for a Queue Length 265 in the RTU Queues 260 that is less than the minimum number (e.g., a minimum threshold), in the example a number of RTU Block Stripes that is less than four (4). It can be appreciated that the minimum threshold of RTU Block Stripes can be a settable number, a predefined number, a predetermined number, an adjustable number, and/or a programmable number, and can be set at any desired value.

It can be further appreciated, that the system, preferably the controller 250, can identify which Die3/Plane #combinations are low on one or more RTU Block Stripes. In an approach, the system, preferably the controller 250, can use the RTU Queues 260, and in an aspect, the Queue Length 265 to identify Die #/Plane #combinations that are low on one or more RTU Block Stripes needed to form a Block Stripe Set. In an embodiment, the RTU Queues 260 that have a Queue Length 265 less than the minimum threshold are identified as the one or more Die #/Plane #combinations (e.g., and form the determined one or more Die #/Plane #combinations) that are low on one or more RTU Block Stripes needed to form a Block Stripe Set. Other methods of identifying the one or more Die #/Plane #combinations that are low on one or more RTU Blocks Stripes needed to form a Block Stripe Set are contemplated.

In the example of FIG. 6, each entry in RTU queue 260A for Die 0 has a Queue Length 265 of six (6) or greater indicating that at least six (6) RTU Block Stripe Sets 420 can be formed for Die 0 because there are >=6 RTU Block Stripes 415 for Planes 0-7 in Die 0. Accordingly, for Die 0 memory media 111 is not low on RTU Block Stripe Sets 420 as each Plane 308 (Planes 0-7) in Die 0 has a minimum of six (6) Block Stripes 415 that are RTU (e.g., 6 RTU Block Stripes). However, for Die 5, only two RTU Block Stripe Sets 420 can be formed because the Queue Length 265 in RTU Queue 260F for Die 5, Plane 6 is two, indicating that only two Block Stripes 415 in Die 5, Plane 6 (D5/P6) are RTU (e.g., only 2 RTU Block Stripes 415). In addition, the Queue Length 265 in RTU Queue 260F for Die 5, Plane 3 (D5/P3) is three (3), which indicates that the number of RTU Block Stripes 415 for D5/P3 is three so the number of RTU Block Stripe Sets 420 that can be formed for D5/P3 is limited to three (3). Accordingly, as Die 5 has at least one Plane (and in this example two Planes (Planes 3 and 6)) that has a Queue Length 265 that is less than the threshold of four (4), it is determined that memory media is low on RTU Block Stripe Sets 420 for Die 5. Moreover, as Die 5, Planes 3 and 6 are determined to be low on one or more RTU Block Stripe Sets 415 needed for form a RTU Block Stripe Set 420, Die 5, planes 3 and 6 are identified as the one or more Die #/Plane #combinations that are low on one or more RTU Block Stripes 415 needed to form a RTU Block Stripe Set 420.

If at 510, memory is not low on RTU Block Stripe Sets (510: No), then the process 500 continues to 540 where preparing Blocks Stripes for programming (making RTU) ends. If on the other hand memory media is low on RTU Block Stripe Sets (510: Yes), then process 500 preferably proceeds to 520 where a Ready-to-Remove process is established. In an aspect, a need is established for garbage collection (e.g., a Ready-To-Remove (RTR) process is established) for those Die #/Plane #combinations that are low on one or more RTU Block Stripes 415 that are needed to form one or more RTU Block Stripe Sets 420. In the example of FIG. 6, a need for garbage collection (e.g., RTR process) for both Die 5, Planes 3, 6 would be set. In an approach, establishing the need for garbage collection, also referred to as a Ready-to-Remove (RTR) process (and/or a request to remove process), is controlled by setting indications (e.g., setting a request for removal process) in the two-dimensional Ready-to-Remove (RTR) [Die #][Plane #] array for the identified Die #/Plane #combinations. The RTR [Die #] [Plane #] array in an embodiment can take the form:
    xRTR    [CM_MZ_MAX_NUM_DIES_PER_CHN] [CM_MZ_MAX_NUM_DIES_PER_CHN]
In the example of FIG. 6, indications for a RTR process would be set in xRTR [D5][P3] array and in xRTR [D5] [P6] array. The process of acting on the Ready-to-Remove (RTR) process (the request to remove process) established at 520 is described in more detail in process 700 with the benefit of FIG. 7.

In an aspect, the need for garbage collection (e.g., RTR process) optionally sets the desired health of the Blocks to be garbage collected. Collecting Blocks in groupings having the same level of health is desirable, but is not a requirement. For example, Blocks can be grouped according to their health or level of "dirtiness", and Block Stripes can be formed from Blocks according to their health level to form Block Stripes of certain health levels. For example, Blocks can be grouped into levels of dirtiness, for example, "100% dirty", ">95% dirty", ">66% dirty", ">50% dirty", ">33% dirty", ">2% dirty", and "<=2% dirty." Block Stripes can be grouped into different categories of health level, such as, for example, "Good Health", "Better Health", "Best Health", and "Very Nearly Bad Health". Other levels of health and/or dirtiness can be used for the Blocks and Block Stripes. In an embodiment, a need for garbage collection/removal (RTR process) is established and/or accomplished by setting indications in the two dimensional xRTR [Die #] [Plane #] array along with the desired health of the Blocks to be removed.

In an alternative embodiment, if at 510, memory media is low on one or more RTU Block Stripe Sets that are RTU (510: Yes), process 500 can proceed along dashed arrow 515 from 510 to process 530, without undergoing process 520. After 520, process 500 preferably proceeds to 530, however, in an alternative embodiment, process 500 after 520 proceeds as shown by dashed arrow 525 to 540 where the process 500 of making Block Stripe Sets RTU ends (e.g., the method 500 of forming RTU Block Stripe Sets concludes).

Figure 7:
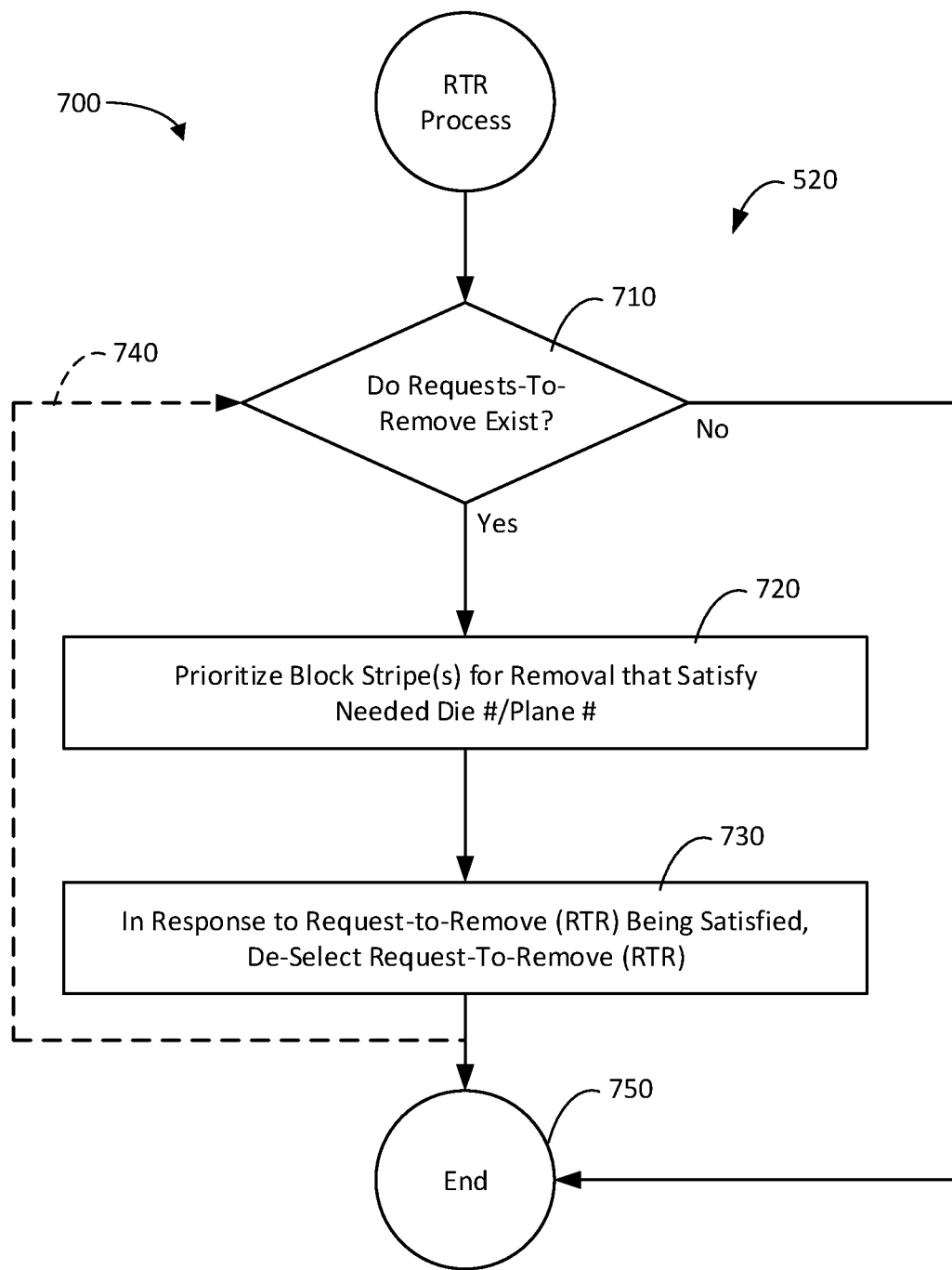
FIG. 7 illustrates a flowchart of a method of managing memory media and in particular a method of removing memory media according to an embodiment of the disclosure.

It can be appreciated, that the process 500 of making RTU Block Stripe Sets can continue after 520, for example to the process 700 described in FIG. 7, but in an approach does not involve process 530.

In one or more embodiments, at 530 a Ready-To-Erase (RTE) process is established. In an aspect, at 530 a need is established for erasure of Block Stripes from those Die #/Plane #combinations that are low on one or more RTU Block Stripes 415 needed to form one or more RTU Block Stripe Sets 420. In the example of FIG. 6, a need for erasure (e.g., RTE process) for both Die 5, Planes 3, 6 would be set. At 530 a need is established to erase Block Stripes from certain Die #/Plane #combinations, where the need may take the form of a request to erase process for certain Die #/Plane #combinations. In other words, a request to erase Block Stripes from certain Die #/Plane #is set at 530. In an approach, establishing the need for erasure, also referred to as a Ready to Erase (RTE) process, a request to erase process, or a request for erasure process), is controlled by setting indications (e.g., setting a request for erasure process) in the two-dimensional Ready-to-Erase (RTE) [Die #][Plane #] array. The RTE [Die #][Plane #] array in an embodiment would take the form of:
    xRTE    [CM_MZ_MAX_NUM_DIES_PER_CHN] [CM_MZ_MAX_NUM_DIES_PER_CHN]
In the example of FIG. 6, indications for a RTE process would be set in xRTE [D5] [P3] array and in xRTE [D5] [P6] array. The process of acting on the request to erase established at 530 is described in more detail in process 800 with the benefit of FIG. 8. That is, acting on and implementing the need to erase set at 530 is described in process 800 with the benefit of FIG. 8.

In an aspect, setting and/or establishing the need for erasure (e.g., establish/set RTE process or request to erase process) for certain Die #/Plane #combinations optionally sets the desired health of the Blocks to be erased. Erasing Blocks in groupings having the same level of health is desirable but is not a requirement. In an embodiment, setting and/or establishing a need for erasure (setting/establishing RTE process or request to erase process for certain Die #/Plane #combinations) is accomplished by setting indications in the two dimensional RTE [Die #] [Plane #] array with the desired health of the Blocks to be erased.

FIG. 7 is an exemplary flowchart in accordance with an embodiment illustrating and describing a method 700 of handling and/or managing memory media, for example, flash memory media, so that the memory media is ready to be programmed with data, e.g., Ready-to-Use (RTU), and describes a method 700 where a Ready-To-Remove (RTR) process (a collection/removal process) is implemented. While the method 700 is described for the sake of convenience and not with an intent of limiting the disclosure as comprising a series and/or a number of steps, it is to be understood that the process 700 does not need to be performed as a series of steps and/or the steps do not need to be performed in the order shown and described with respect to FIG. 7, but the process 700 may be integrated and/or one or more steps may be performed together, simultaneously, or the steps may be performed in the order disclosed or in an alternate order.

In a Ready-To-Remove (RTR) process (removal/collection process) 700, at 710 it is determined whether any requests-to-remove memory media exist (e.g., whether any needs/requests to garbage collect were set). That is, in an embodiment, at 710 it is determined whether any RTR needs, RTR requests or requests to erase were set at 520 in process 500. In this regard, the need to remove, e.g., garbage collect, was set at 520 in process 500 for specific Planes in specific Dies. That is, in an embodiment, the request to remove process was set for identified Die #/Plane #combinations that are low on one or more RTU Block Stripe Sets 415 needed to form a Block Stripe Set 420. In an aspect, at 710 it is determined whether any indications were set in the two dimensional RTR [Die #] [Plane #] array. If at 710 it is determined that there are no outstanding requests to remove media (e.g., no needs or requests for removal process were set) (710: No), then process 700 proceeds to 750 where the Ready-To-Remove (RTR) process or the request to remove process 700 concludes.

If at 710 it is determined that any requests-to-remove or needs to remove were set (e.g., are pending/outstanding) (710: Yes), then process 700 continues to 720 where priority is given to garbage collect for Block Stripes 415 on Die #/Plane #combinations that have a need. In other words, at 720 searching is prioritized in an embodiment to Die #/Plane #combinations where a need has been identified, determined, and/or established for garbage collection (where a request to remove has been established). In an aspect, one or more Block Stripe(s) that are from the needed Die #/Plane #combination are prioritized at 720 for the removal process. That is, in an approach, at 720, priority is given to selecting a Block Stripe for the removal process that is from a Die #/Plane #combination that facilitates forming a RTU Block Stripe Set. In an embodiment, the Block Stripe selection process involves searching to find one or more Block Stripes for the removal process for the Dies/Planes that are in need of a RTU Block Stripe Set.

In an aspect, the Block Stripe selection process at 720 involves searching RTR Queues 262 to find a Block Stripe for the needed Die #/Plane #. It can be appreciated that RTR Queues 262 can be organized by Die #/Plane #similar to RTU Queues 260 shown in FIG. 6, but which according to an embodiment can be ordered by level of "dirtiness". That is, the search for one or more Block Stripes to undergo the removal process are prioritized to the needed Die #/Plane #identified, determined, and/or established at 520. In an approach, at 720 certain Planes in certain Dies that need to have Blocks undergo the removal/collection process in order to form one or more RTU Blocks Stripes (that are needed to form a RTU Block Stripe Set) are prioritized for searching, for example, without regard to the level of the health of the Block (or memory cell) (e.g., without regard to number of writing operations the Block or memory cell has undergone). Where a need/request to remove is established for a particular Die #/Plane #combination, then at 720 searching for one or more Blocks to form one or more RTU Block Stripes in an embodiment is limited first to those particular identified, determined, and/or established Die #/Plane #combinations that are low on one or more RTU Block Stripes needed to form a RTU Block Stripe Set (e.g., have an established, pending, and/or outstanding request/need for removal), without regard to dirtier media in other non-critical Die #/Plane #combinations, for example where a need has not been established. It can be appreciated, that the searching within the particular Die #/Plane #that is low on one or more RTU Block Stripes needed to form a RTU Block Stripe Set (e.g., a particular Die #/Plane #that has a need or outstanding request for the removal process), can be based upon the level of dirtiness.

In situations where there are multiple Die #/Plane #(Die/Plane combinations) that need garbage collection/removal (e.g., have an outstanding request or need to remove), for example Die 5, planes 3, 6 in FIG. 6, then one Die #/Plane #combination is selected via round robin to process first, followed by the other Die #/Plane #combinations. In an aspect, it is determined which Dies and/or Planes need Blocks to form one or more RTU Block Stripes (and e.g., where those RTU Block Stripes can be used to create a RTU Block Stripe Set), and those Dies and Planes at 720 are prioritized and searched for qualifying Blocks to undergo the removal/collection process to form one or more RTU Block Stripes, and where those one or more RTU Block Stripes can be used to create a RTU Block Stripe Set.

In one or more embodiments, in response to searching, locating, identifying, and/or selecting the one or more Blocks and/or Block Stripes needed to undergo the removal/collection process to form one or more RTU Block Stripes (e.g., the prioritized Blocks/Block Stripes in the needed Die #/Plane #combinations), the one or more Blocks/Block Stripes prioritized to form the RTU Block Stripes undergo the removal/collection process. After 720, and in an approach after having the selected one or more Blocks/Block Stripes undergo the removal/collection process, process 700 can proceed to 730 where in response to a request-to-remove (e.g., Ready-To-Remove process) being satisfied, that request to remove is de-selected and turned off (the need to remove is de-established), which can prevent that particular Ready-To-Remove (RTR) process, request to remove, or established need to remove from being acted upon multiple times. In an embodiment, given that a Block Stripe was selected for garbage collection (for removal), the indication in the xRTR [Die #][Plane #] array can be reset (e.g., set to zero) for the Die #/Plane #undergoing the garbage collection/removal process.

After 730, process 700 can proceed as shown by dashed line 740 back to 710 where it can be determined whether any further requests-to-remove (established need to remove, or outstanding RTR processes) are pending, e.g., exist. If there are outstanding and/or pending requests-to-remove (e.g., established need to remove or RTR processes), process 700 can continue to 720 and 730 once again. In the situation where no further requests-to-remove are pending (e.g., RTR processes complete and no more established needs to remove) (710: No), then the process 700 continues to 750 where the RTR process 700 concludes. That is, in the situation where, after 730, there are no pending requests-to-remove (no outstanding need to remove), process 700 proceeds to 750 where the RTR process 700 concludes.

Figure 8:
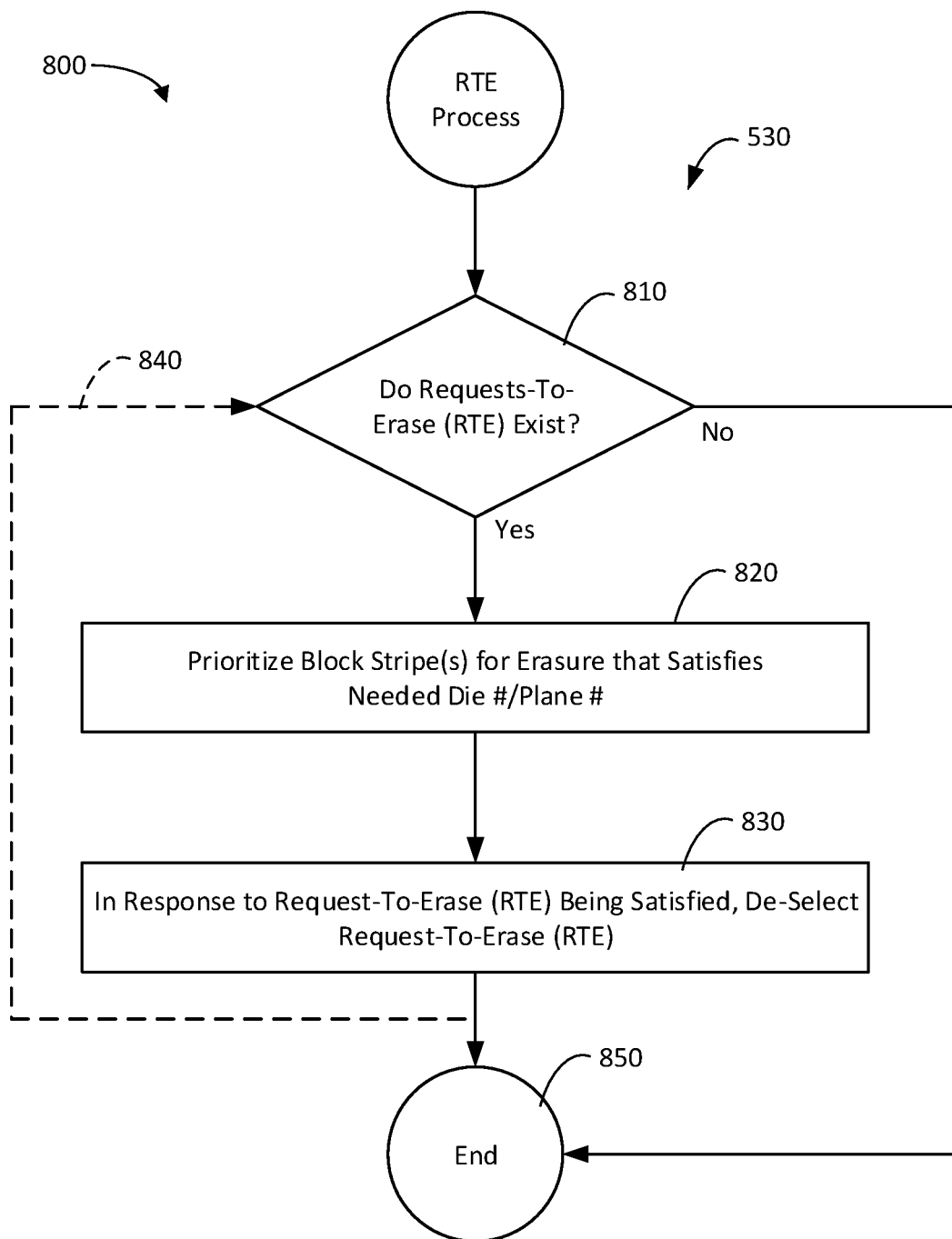
FIG. 8 illustrates a flowchart of a method of managing memory media and in particular a method of erasing memory media according to an embodiment of the disclosure.

FIG. 8 is an exemplary flowchart in accordance with an embodiment illustrating and describing a method 800 of handling and/or managing memory media, for example, flash memory media, so that the memory media is ready to be programmed with data, e.g., Ready-to-Use (RTU), and describes a method 800 where a Ready-To-Erase (RTE) process is implemented. While the method 800 is described for the sake of convenience and not with an intent of limiting the disclosure as comprising a series and/or a number of steps, it is to be understood that the process 800 does not need to be performed as a series of steps and/or the steps do not need to be performed in the order shown and described with respect to FIG. 8, but the process 800 may be integrated and/or one or more steps may be performed together, simultaneously, or the steps may be performed in the order disclosed or in an alternate order.

In Ready-To-Erase (RTE) (erasure) process 800, at 810 it is determined whether any requests-to-erase memory media are pending (e.g., whether any needs/request to erase memory media were set). That is, at 810 in an embodiment it is determined whether any RTE needs, RTR requests, or requests to erase were set at 530 in process 500. In this regard, in an approach the need to erase memory media was set (a request to erase memory media was set (a request to undergo a RTE process) at 530 in process 500 for specific Die #/Plane #combinations (e.g., for specific Planes in specific Dies). That is, in an embodiment, the request to erase memory media was set for identified Die #/Plane #combinations that are low on one or more RTU Block Stripes 415 needed to form a Block Stripe Set 420. In an aspect, at 810 it is determined whether any indications were set in the two dimensional RTE [Die #] [Plane #] array. If at 810 it is determined that there are no outstanding requests-to-erase media (e.g., no needs or requests set to undergo a RTE process) (810: No), then process 800 proceeds to 850 where the Ready-To-Erase (RTE) process 800 concludes.

If at 810 it is determined that requests-to-erase or needs to erase are outstanding, pending, and/or set (810: Yes), then process 800 continues to 820 where priority is given to undergo the erasure process for one or more Block Stripes 415 on Die #/Plane #combinations where a request or need to erase is outstanding. In other words, at 820 searching is prioritized in an embodiment to Die #/Plane #combinations where a need has been identified, determined, and/or established for erasure (where a request to erase has been established). In an aspect, at 820 certain Blocks and/or Block Stripes are prioritized for the erasure process, and more particularly according to an approach, priority is given to select for one or more Block Stripes for a Die #/Plane #determined to be in need of undergoing the erasure process to create one or more RTU Block Stripes 415. In an approach, at 820 one or more Block Stripes that are from the needed Die #/Plane #are prioritized for the erasure process. That is, in an approach, at 820 priority is given to searching/selecting a Block Stripe for the erasure process that is from a Die #/Plane #combination that facilitates forming a RTU Block Stripe Set. In an embodiment, the Block Stripe selection process involves searching to find one or more Block Stripes to undergo the erasure process for Die #s/Plane #s that are in need of a RTU Block Stripe Set.

In an aspect, the Block Stripe selection process at 820 involves searching RTE Queues 264 for Block Stripes that are for the needed Die #/Plane #combinations. It can be appreciated that RTE Queues 264 can be organized by Plane #/Die #similar to RTU Queues 260 shown in FIG. 6. According to an embodiment there is one RTE Queue 264 per Die #/Plane #, and accordingly searching RTE Queues 264 identifies Block Stripes that are Ready-to-Erase. That is, the search for one or more Block Stripes to undergo the erasure process are prioritized to the needed Die #/Plane #identified, determined, and/or established at 530. In an approach, at 820 certain Planes in certain Dies that need to have Blocks undergo the erasure process in order to form one or more RTU Blocks Stripes (that are needed to form a RTU Block Stripe Set) are prioritized for searching, for example, without regard to the level of the health of the Block (or memory cell) (e.g., without regard to number of writing operations the Block or memory cell has undergone). Where a need/request to erase is established for a particular Die #/Plane #combination, then at 820 searching for one or more Blocks to form one or more RTU Block Stripes in an embodiment is limited first to those particular identified, determined, and/or established Die #/Plane #combinations that are low on one or more RTU Block Stripes needed to form a RTU Block Stripe Set (e.g., have an established, pending, and/or outstanding request/need for erasure), without regard to media in other non-critical Die #/Plane #combinations, for example where a need for erasure has not been established. It can be appreciated, that the searching within the particular Die #/Plane #that is low on one or more RTU Block Stripes needed to form a RTU Block Stripe Set (e.g., a particular Die #/Plane #that has a need or outstanding request for the erasure process), can be based upon the health level of the Blocks/Block Stripes.

When there are multiple Die #/Plane #in need of Block Stripes that are Ready to Erase (e.g., have an outstanding request or need to erase), like in the example above where both D5/P3 and D5/P6 were in need of forming one or more RTU Block Stripes, then one Die #/Plane #combination is selected via round robin to process first, followed by the other Die #/Plane #combinations when they are both the same Die #(as in the above example where both needs are on D5), or multiple Die #/Plane #combinations can be selected for simultaneous processing if the need is on different Die numbers.

In one or more embodiments, in response to searching, locating, identifying, and/or selecting the one or more Blocks and/or Block Stripes needed to undergo the erasure process to form one or more RTU Block Stripes (e.g., the prioritized Blocks/Block Stripes in the needed Die #/Plane #combinations), the one or more Blocks/Block Stripes prioritized to form the RTU Block Stripes undergo the erasure process. After 820, and in an approach after having the selected one or more Blocks/Block Stripes undergo the erasure process, process 800 can proceed to 830 where in response to a request-to-erase (e.g., RTE process) being satisfied, that request-to-erase is de-selected and turned off (the need/request to erase is de-established), which can prevent that particular request-to-erase being acted upon multiple times. In an aspect, given that one or more Block Stripes were selected to undergo the erasure process, the indication(s) in the xRTE[Die #][Plane #] array can be reset (set to zero) for the Die #/Plane #undergoing the erasure process.

After 830, process 800 can proceed as shown by dashed line 840 back to 810 where it can be determined whether any further requests-to-erase (e.g., established need for erasure or outstanding RTE processes) are pending, e.g., exist. If there are outstanding and/or pending requests-to-erase (e.g., established need to erase or RTE processes), process 800 can continue to 820 and 830 once again. In the situation where no further requests-to-erase are pending (e.g., RTE processes complete or no more established needs to erase) (810: No), then the process 800 continues to 850 where the RTE process 800 concludes. That is, in the situation where, after 830, there are no pending requests-to-erase (no outstanding needs to erase or RTE processes), process 800 proceeds to 850 where the RTE process 800 concludes.

Accordingly, blocks/steps of the flowchart illustrations of FIGS. 5 & 7-8 support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems that perform the specified functions or steps, or by combinations of special purpose hardware and computer instructions.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Moreover, a system according to various embodiments may include a processor and logic integrated with and/or executable by the processor, the logic being configured to perform one or more of the process steps recited herein. By integrated with, what is meant is that the processor has logic embedded therewith as hardware logic, such as an application specific integrated circuit (ASIC), a field programmable gate array (FPGA), etc. By executable by the processor, what is meant is that the logic is hardware logic; software logic such as firmware, part of an operating system, part of an application program; etc., or some combination of hardware and software logic that is accessible by the processor and configured to cause the processor to perform some functionality upon execution by the processor. Software logic may be stored on local and/or remote memory of any memory type, as known in the art. Any processor known in the art may be used, such as a software processor module and/or a hardware processor such as an ASIC, a FPGA, a central processing unit (CPU), an integrated circuit (IC), a graphics processing unit (GPU), etc.

It will be clear that the various features of the foregoing systems and/or methodologies may be combined in any way, creating a plurality of combinations from the descriptions presented above.

It will be further appreciated that embodiments of the present invention may be provided in the form of a service deployed on behalf of a customer to offer service on demand.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method of managing memory media for storing data in a memory system, the method comprising:
   determining whether the memory system is low on one or more ready-to-use (RTU) Block Stripes needed to form a RTU Block Stripe Set,
      wherein each RTU Block Stripe is formed of a plurality of memory media Blocks configurable to store data and all the memory media Blocks in each RTU Block Stripe are from the same Die #and the same Plane #where the memory media has a plurality of Planes in each Die, where all the memory media Blocks in each RTU Block Stripe have been subject to a removal process and an erasure process, and
      wherein each RTU Block Stripe Set is formed of a plurality of RTU Block Stripes and all RTU Block Stripes in each RTU Block Stripe Set are from the same Die #, where all the memory media Blocks in each RTU Block Stripe Set have been subject to the removal process and the erasure process;
   establishing, in response to the memory system being low on one or more RTU Block Stripes needed to form a RTU Block Stripe Set, a pending request for a removal process for one or more determined Die #/Plane #combinations to create one or more RTU Block Stripes needed to form a RTU Block Stripe Set; and
   prioritizing, in response to a pending request for a removal process for one or more determined Die #/Plane #combinations, in the one or more determined Die #/Plane #combinations one or more memory media Blocks for the removal process that create one or more RTU Block Stripes needed to form a RTU Block Stripe Set.

2. The method according to claim 1, wherein determining whether the memory system is low on one or more RTU Block Stripes needed to form a RTU Block Stripe Set comprises identifying one or more determined Die #/Plane #combinations low on one or more RTU Block Stripes needed to form a RTU Block Stripe Set.

3. The method according to claim 1, wherein determining whether the memory system is low on one or more RTU Block Stripes needed to form a RTU Block Stripe Set comprises:
   reviewing a RTU Queue that tracks for each Die #/Plane #combination a number of RTU Block Stripes; and
   determining, in response to reviewing the RTU Queue, a maximum number of RTU Block Stripe Sets per Die #.

4. The method according to claim 3, wherein determining whether the memory system is low on one or more RTU Block Stripes needed to form a RTU Block Stripe Set further comprises:
   comparing the determined maximum number of RTU Block Stripe Sets per Die #to a minimum threshold of RTU Block Stripe Sets per Die #; and
   determining, in response to the determined maximum number of RTU Block Stripe Sets per Die #being less than the minimum threshold of RTU Block Stripe Sets per Die #, that the memory system is low on one or more RTU Block Stripes needed to form a RTU Block Stripe Set.

5. The method according to claim 4, wherein the minimum threshold of RTU Block Stripe Sets per Die #is at least one of a group consisting of: a settable, a fixed, a predetermined, a predefined, an adjustable, a programmable, or combinations thereof, number of RTU Block Stripe Sets per Die #.

6. The method according to claim 2, wherein identifying one or more determined Die #/Plane #combinations comprises:
   reviewing a RTU Queue that tracks for each Die #/Plane #combination a number of RTU Block Stripes;
   identifying, in response to reviewing the RTU Queue, the one or more determined Die #/Plane #combinations that cannot create a sufficient number of RTU Blocks Stripes needed to form a RTU Block Stripe Set.

7. The method according to claim 2, wherein prioritizing in the one or more determined Die #/Plane #combinations one or more memory media Blocks for the removal process that create a RTU Block Stripe needed to form a RTU Block Stripe Set comprises prioritizing garbage collection on the identified one or more determined Die #/Plane #combinations one or more memory media Blocks that will create one or more RTU Block Stripes needed to form a RTU Block Stripe Set.

8. The method according to claim 1, further comprising determining whether there is a pending request for a removal process for the one or more determined Die #/Plane #combinations.

9. The method according to claim 1, wherein prioritizing in the one or more determined Die #/Plane #combinations one or more memory media Blocks for the removal process that create one or more RTU Block Stripes needed to form a RTU Block Stripe Set comprises prioritizing searching RTR Queues for one or more Block Stripes for the removal process on the identified one or more determined Die #/Plane #combinations low on one or more RTU Block Stripes needed to form a RTU Block Stripe Set.

10. The method according to claim 9, wherein the RTR Queues are organized by Die #/Plane #combinations and by level of dirtiness.

11. The method according to claim 1, wherein prioritizing in the one or more determined Die #/Plane #combinations one or more memory media Blocks for the removal process that create one or more RTU Block Stripes needed to form a RTU Block Stripe Set comprises limiting searching for one or more memory media Blocks for the removal process that create one or more RTU Block Stripes needed to form a RTU Block Stripe Set, first to the determined Die #/Plane #combinations.

12. The method according to claim 1, further comprising de-selecting, in response to a pending request for a removal process for one or more determined Die #/Plane #combinations to create one or more RTU Block Stripes needed to form a RTU Block Stripe Set being satisfied, the pending request for a removal process for the determined one or more Die #/Plane #combinations.

13. The method according to claim 1, further comprising:
establishing, in response to the memory system being low on one or more RTU Block Stripes needed to form a RTU Block Stripe Set, a pending request for an erasure process for one or more determined Die #/Plane #combinations to create one or more RTU Block Stripes needed to form a RTU Block Stripe Set; and
prioritizing, in response to a pending request for an erasure process for one or more determined Die #/Plane #combinations, in the one or more determined Die #/Plane #combinations one or more memory media Blocks for the erasure process that create one or more RTU Block Stripes needed to form a RTU Block Stripe Set.

14. The method according to claim 13, wherein determining whether the memory system is low on one or more RTU Block Stripes needed to for a RTU Block Stripe Set comprises identifying one or more determined Die #/Plane #combinations low on one or more RTU Block Stripes needed to from a RTU Block Stripe Set, and prioritizing in the one or more determined Die #/Plane #combinations one or more memory media Blocks for the erasure process that create one or more RTU Block Stripes needed to form a RTU Block Stripe Set comprises prioritizing searching RTE Queues for one or more RTU Block Stripes for the erasure process on the identified one or more determined Die #/Plane #combinations low on one or more RTU Block Stripes needed to form a RTU Block Stripe Set, wherein the RTE Queues are organized by Die #/Plane #combinations.

15. The method according to claim 13, wherein prioritizing in the one or more determined Die #/Plane #combinations one or more memory media Blocks for the erasure process that create one or more RTU Block Stripes needed to form a RTU Block Stripe Set comprises limiting searching for one or more memory media Blocks for the erasure process that create one or more RTU Block Stripes needed to form a RTU Block Stripe Set, first to the determined Die #/Plane #combinations.

16. A method of managing memory media for storing data in a memory system, the method comprising: determining whether the memory system is low on one or more ready-to-use (RTU) Block Stripes needed to form a RTU Block Stripe Set, wherein each Block Stripe is formed of a plurality of memory media Blocks configurable to store data and all the memory media Blocks in each Block Stripe are from the same Die #and the same Plane #where the memory media has a plurality of Planes in each Die, where all the memory media Blocks in each RTU Block Stripe have been subject to a removal process and an erasure process, and wherein each RTU Block Stripe Set is formed of a plurality of RTU Block Stripes and all RTU Block Stripes in each RTU Block Stripe Set are from the same Die #, where all the memory media Blocks in each RTU Block Stripe Set have been subject to the removal process and the erasure process;
establishing, in response to the memory system being low on one or more RTU Block Stripes needed to form a RTU Block Stripe Set, a pending request for an erasure process for one or more determined Die #/Plane #combinations to create one or more RTU Block Stripes needed to form a RTU Block Stripe Set; and prioritizing, in response to a pending request for an erasure process for one or more determined Die #/Plane #combinations, in the one or more determined Die #/Plane #combinations one or more memory media Blocks for the erasure process that create one or more RTU Block Stripes needed to form a RTU Block Stripe Set.

17. The method according to claim 16, wherein determining whether the memory system is low on one or more RTU Block Stripes needed to form a RTU Block Stripe Set comprises identifying one or more determined Die #/Plane #combinations low on one or more RTU Block Stripes needed to form a RTU Block Stripe Set.

18. The method according to claim 16, wherein determining whether the memory system is low on one or more RTU Block Stripes needed to form a RTU Block Stripe Set comprises:
reviewing a RTU Queue that tracks for each Die #/Plane #combination a number of RTU Block Stripes; and
determining, in response to reviewing the RTU Queue, a maximum number of RTU Block Stripe Sets per Die #;
comparing the determined maximum number of RTU Block Stripe Sets per Die #to a minimum threshold of RTU Block Stripe Sets per Die #; and
determining, in response to the determined maximum number of RTU Block Stripe Sets per Die #being less than the minimum threshold of RTU Block Stripe Sets per Die #, that the memory system is low on one or more RTU Block Stripes needed to form a RTU Block Stripe Set.

19. The method according to claim 16, further comprising:
establishing, in response to the memory system being low on one or more RTU Block Stripes needed to form a RTU Block Stripe Set, a pending request for a removal process for one or more determined Die #/Plane #combinations to create one or more RTU Block Stripes needed to form a RTU Block Stripe Set; and
prioritizing, in response to a pending request for a removal process for one or more determined Die #/Plane #combinations, in the one or more determined Die #/Plane #combinations one or more memory media Blocks for the erasure process that create one or more RTU Block Stripes needed to form a RTU Block Stripe Set.

20. A system for storing data, the system comprising:
a non-transitory memory media configurable to store data, the non-transitory memory media organized in a plurality of channels where each channel has a plurality of Dies, each Die has a plurality of Planes, each Plane has a plurality of Blocks, and each Block has a plurality of Pages configurable to store data,
wherein a Block Stripe is formed of a plurality of Blocks all from the same Die #and the same Plane #, and a Block Stripe Set is formed of a plurality of Block Stripes and all Block Stripes in each Block Stripe Set are from the same Die #; and
a controller for managing and configuring the non-transitory memory media to be ready-to-use where it is configured to store data, wherein the non-transitory memory media is ready to use when it has been subject to a removal process and an erasure process,
wherein the system is configured to:
determine whether the memory system is low on one or more ready-to-use (RTU) Block Stripes needed to form a RTU Block Stripe Set, wherein all Blocks in a RTU Block Stripe have been subject to the removal process and the erasure process, and all the RTU Block Stripes in each RTU Block Stripe Set have been subject to the removal process and the erasure process;

identify, in response to determining that the memory system is low on one or more RTU Block Stripes needed to form a RTU Block Stripe set, one or more determined Die #/Plane #combinations low on one or more RTU Block Stripes needed to form a RTU Block Stripe Set;

prioritize, in response to determining that the memory system is low on one or more RTU Block Stripes needed to form a RTU Block Stripe Set, one or more Blocks to undergo the removal process in the identified one or more determined Die #/Plane #combinations to create one or more RTU Block Stripes needed to form a RTU Block Stripe Set; and prioritize, in response to determining that the memory system is low on one or more RTU Block Stripes needed to form a RTU Block Stripe Set, one or more Blocks to undergo the erasure process in the identified one or more determined Die #/Plane #combinations to create one or more RTU Block Stripes needed to form a RTU Block Stripe Set.

* * * * *